United States Patent [19]

Nishimori

[11] Patent Number: 4,918,634
[45] Date of Patent: Apr. 17, 1990

[54] KEY INPUT APPARATUS

[75] Inventor: Kadotaro Nishimori, Osaka, Japan

[73] Assignee: Minolta Camera Kabushiki Kaisha, Osaka, Japan

[21] Appl. No.: 158,660

[22] Filed: Feb. 22, 1988

[30] Foreign Application Priority Data

Feb. 23, 1987 [JP] Japan .................................. 62-39697
Feb. 27, 1987 [JP] Japan .................................. 62-46072
Feb. 27, 1987 [JP] Japan .................................. 62-46073

[51] Int. Cl.[4] ............................................ G06F 3/023
[52] U.S. Cl. .................................. 364/709.12; 341/22
[58] Field of Search ................ 364/709.12, 709.01; 341/20, 22; 307/15; 235/145 R

[56] References Cited

U.S. PATENT DOCUMENTS 3,940,758  2/1976  Margolin .................. 364/709.12
4,015,254  3/1977  Strandt ........................... 341/22
4,583,189  4/1986  Koyama .................. 364/709.12

FOREIGN PATENT DOCUMENTS

53-20331   2/1978  Japan .
60-74011   4/1985  Japan ................... 364/709.01
0239616   11/1985 Japan ........................... 307/15

Primary Examiner—David H. Malzahn
Attorney, Agent, or Firm—Price, Gess & Ubell

[57] ABSTRACT

This invention relates to a key input apparatus used for inputting the information into various electronic equipments, such as a computer or a computer applied equipment, and the key input apparatus according to this invention has a variable resistance circuit which comprises a plurality of key switches and a plurality of resistance elements connected thereto and changes the resistance value thereof corresponding to the depressed key switch. The apparatus can generate analog voltage corresponding to the change in the resistance value and convert the analog voltage into a digital signal to thereby discriminate the depressed key switch on the basis of the output of the digital signal, whereby the number of signal conductors or terminals between the keyboard and the equipment to be inputted with information is reduced.

19 Claims, 8 Drawing Sheets

KEY INPUT APPARATUS

BACKGROUND OF THE INVENTION

1. Field of the Invention

This invention relates to a key input apparatus for inputting information into various electronic equipments, such as computer or a computer applied equipment.

2. Description of the Prior Art

A key input apparatus comprising a large number of key switches is used for inputting the information into an electronic equipment, such as a computer or a computer applied equipment.

The simplest construction of the key input apparatus is to connect terminals of the large number of key switches and input parts of the main body at the electronic equipment by use of independent signal conductors so as to transmit signals from the key switches separately to the input ports respectively. Such constitution, however, increases corresponding to the number of key switches and the number of signal conductors between a key board or a console panel on which the key switches are mounted and the main body having input ports, thereby creating a problem in that when the number of terminals and connectors increases, the rate of the occurrence of trouble, such as imperfect contact or disconnection is high, and simplification of the design and work for wiring package or maintenance, is remarkably impeded additionally, the use of electronic equipment directed to miniaturization or integration is impeded from being reduced for miniaturization. In order to solve the above problem, a key input apparatus disclosed in the Japanese Patent Publication No. Sho 53-20331 (1978) has been proposed, which is provided with two signal conductor groups in a matrix and a key switch to each node so that the signal conductors between the key board as above-mentioned and the main body fairly decrease in number, but this reference has a defect in that eleven signal conductors are still required for, for example, thirty key switches and a control circuit for discriminating each switch is complex.

Figure 1:
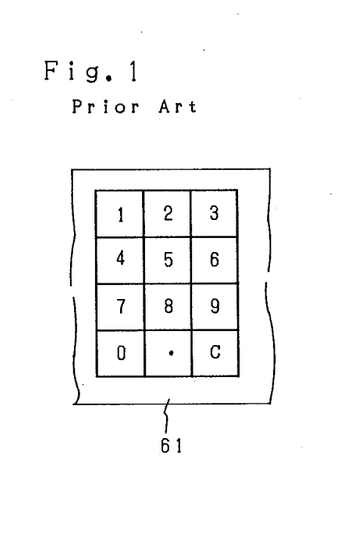
FIGS. 1 and 2 are front views exemplary of arrangements of conventional ten-keys.
Figure 2:
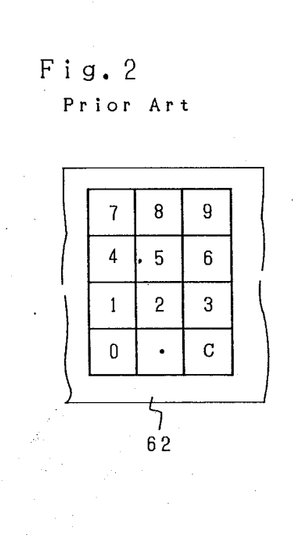

The conventional key input apparatus has fixed arrangement of keys on the keyboard, which arrangement cannot be desirably changed by a user. For example, FIG. 1 shows a ten key 61 for a telephone, in which numeral keys of 1 through 9 are disposed from the leftside upper portion to the rightside lower portion. On the other hand, FIG. 2 shows a ten-key 62 for a desk-top calculator, in which the numeral keys of 1 through 9 are disposed from the leftside lower portion to the rightside upper portion. It depends on the purpose for use or experience in use or choice of the user which key arrangement is convenient to use, but conventionally, the change of arrangement corresponding to the choice of user has been impossible. In a case where the key arrangement is intended to be changed due to an improvement in the apparatus or modification in specification, the change in arrangement also is not easy for a maker as well as the user.

SUMMARY OF THE INVENTION

This invention has been designed in order to solve the above problem. The key input apparatus of the invention has a variable resistance circuit which changes in resistance value by depressing a plurality of key switches separately, thereby discriminating which key switch is depressed on the basis of change in the resistance value.

Accordingly, a first object of this invention is to provide a key input apparatus which can reduce the number of signal conductors between a keyboard and an inputted equipment and the number of terminals.

A second object of this invention is to provide a key input apparatus with a reduction in the number of signal conductors and terminals so as to have no fear that imperfect contact and disconnection of the signal conductor will occur between the keyboard and the inputted equipment.

A third object of this invention is to provide a key input apparatus which has a reduced number of signal conductors and terminals, thereby enabling miniaturization of the apparatus.

A fourth object of this invention is to provide a key input apparatus which is provided with a variable resistance circuit whose total resistance value, when optional plural key switches are simultaneously depressed, is different from that when an optional one key switch is depressed, thereby not misdiscriminating the case where the plural key switches are simultaneously depressed as that where one key switch is depressed.

A fifth object of this invention is to provide a key input apparatus which is separately and detachably provided on the keyboard with a plurality of key units each comprising a key switch and a resistance element, whereby the key units can be provided at the optimum positions on the keyboard, thereby facilitating a change in arrangement or an exchange of the plural key units.

The above and further objects and features of the invention will more fully be apparent from the following detailed description with accompanying drawings.

DESCRIPTION OF THE PREFERRED EMBODIMENTS

Figure 3:
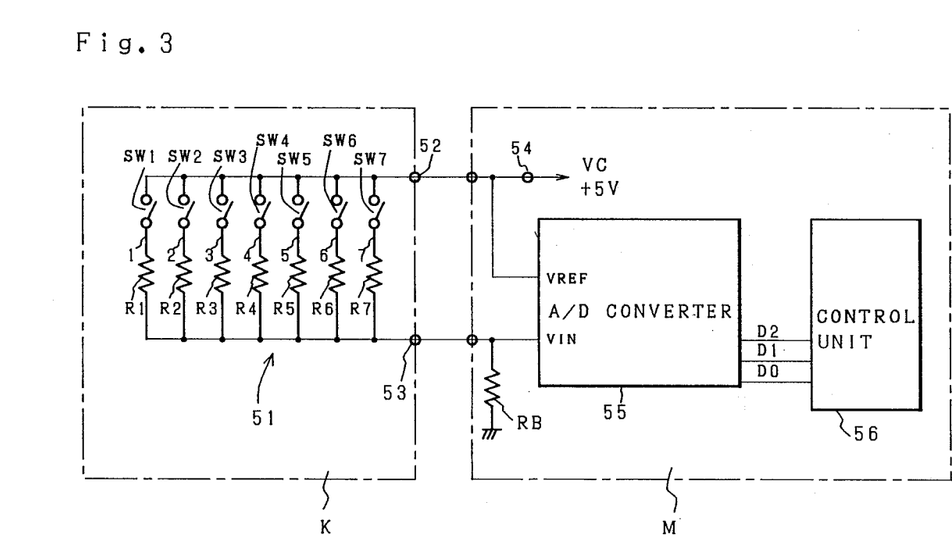
FIG. 3 is a circuit diagram of a first embodiment of the key input apparatus of the invention.

Next, embodiments of the invention will be described in accordance with the accompanying drawings. FIG. 3 is a circuit diagram of a first embodiment of the invention, in which, at a keyboard K, are provided key units 1 through 7 comprising a number of key switches SW1 through SW7 and resistances R1 through R7 connected in series therewith, the key units 1 through 7 being connected in parallel to each other so as to form a variable resistance circuit 51 with output terminals 52 and 53. The main body M is provided with a constant voltage terminal 54 connected to a constant voltage source VC, a reference resistance RB for generating analog voltage VA of value corresponding to the resistance value of the variable resistance circuit 51 due to a voltage dividing ratio to the resistance value RA at the variable resistance circuit 51, an A/D converter 55 for converting the analog voltage VA into a digital signal, and a control unit 56 comprising a microcomputer having input ports. Now, the resolution of A/D converter 55 is assumed to be 3 bits, its reference voltage VREF (equal to voltage of constant voltage source VC) to be 5V, and input voltage VIN and output data to have the relationship as shown in Table 1, in which values in parantheses at the item of input voltage are the medium values.

TABLE 1

| Input Voltage VIN(V) | | Output Data | | |
|---|---|---|---|---|
| 0~0.625 | (0.3125) | 0 | 0 | 0 |
| 0.626~1.250 | (0.9375) | 0 | 0 | 1 |
| 1.251~1.875 | (1.5625) | 0 | 1 | 0 |
| 1.876~2.500 | (2.1875) | 0 | 1 | 1 |
| 2.501~3.125 | (2.8125) | 1 | 0 | 0 |
| 3.126~3.750 | (3.4375) | 1 | 0 | 1 |
| 3.751~4.375 | (4.0625) | 1 | 1 | 0 |
| 4.376~5.000 | (4.6875) | 1 | 1 | 1 |

A value of the reference resistance RB is assumed to be 100 Ω and values of resistance R1 through R7 are set so that analog voltage VA is equal to the medium value of input voltage VIN when the each key switch SW1 through SW7 is depressed respectively, whereby the resistance values are obtained in Table 2 as follows:

TABLE 2

| Resistance | Resistance Value (Ω) |
|---|---|
| R1 | 433.3 |
| R2 | 220.0 |
| R3 | 128.6 |
| R4 | 77.8 |
| R5 | 44.8 |
| R6 | 23.1 |
| R7 | 6.7 |

Then, analog voltage VA generated by the depressed ones among the key switches SW1 through SW 7 is converted by the A/D converter 55 into a digital signal and thereafter output data D0 through D2 are obtained as shown in Table 3.

TABLE 3

| Depressed Key Switch | Output Data | | |
|---|---|---|---|
| | D2 | D1 | D0 |
| none | 0 | 0 | 0 |
| SW 1 | 0 | 0 | 1 |
| SW 2 | 0 | 1 | 0 |
| SW 3 | 0 | 1 | 1 |
| SW 4 | 1 | 0 | 0 |
| SW 5 | 1 | 0 | 1 |
| SW 6 | 1 | 1 | 0 |
| SW 7 | 1 | 1 | 1 |

The output data D0 through D2 are inputted into the control unit 56 and a depressed one of key switches SW1 through SW7 is discriminated, thereby enabling the signal or information corresponding to the depressed switch to be processed at the control unit 56.

In the aforesaid embodiment, the keyboard K and main body M are connected with two signal conductors only, the signal conductors and terminals largely decreasing in number. Accordingly, a connector for connecting them need only be small in number of polarity, whereby the rate of occurrence of trouble caused by imperfect contact or disconnection is low and package and maintenance are easy, thereby facilitating miniaturization of the apparatus.

In the above embodiment, when the key switches are intended to increase in number, the resolution (pitch number) of A/D converter 55 need only be raised and the resistances R1 through R7 be increased and have proper values. Generally, when the bit number of A/D converter 55 is represented by n, the number N of discriminable key switches is $2^n - 1$. For example, an A/D converter of 6 bit resolution, when in use, can discriminate 63 key switches. In this case, two signal conductors also are enough, but the signal conductor may increase in number for an earth line, a pilot lamp or other particular switches.

Figure 4:
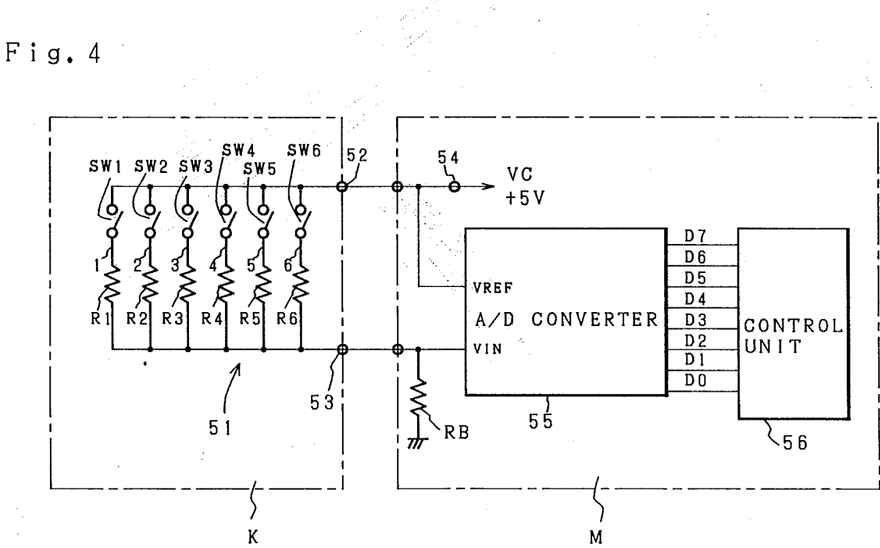
FIG. 4 is a circuit diagram of a second embodiment of the key input apparatus of the invention.

FIG. 4 is a circuit diagram of a second embodiment of the key input apparatus of the invention, in which key units 1 through 6 comprising six key switches SW1 through SW6 and resistances R1 through R6 connected in series therewith respectively are provided on a keyboard K and are connected in parallel to each other, thereby constitiing a variable resistance circuit 51, the resolution of the A/D converter 55 being 8 bits. The input voltage VIN and output data at the second embodiment are assumed to have the relationships shown in Table 4. In addition, other components are the same as those in the first embodiment and therefore omitted in description herein.

TABLE 4

| Input Voltage VIN (V) | Output Data | |
|---|---|---|
| | Binary | Decimal |
| $0 \leq VIN < \left( \frac{VREF}{2^8} \times 0.5 \right)$ | 00000000 | 0 |
| $\left( \frac{VREF}{2^8} \times 0.5 \right) \leq VIN < \left( \frac{VREF}{2^8} \times 1.5 \right)$ | 00000001 | 1 |
| $\left( \frac{VREF}{2^8} \times 1.5 \right) \leq VIN < \left( \frac{VREF}{2^8} \times 2.5 \right)$ | 00000010 | 2 |
| . . . | . . . | . . . |
| $\left( \frac{VREF}{2^8} \times 252.5 \right) \leq VIN < \left( \frac{VREF}{2^8} \times 253.5 \right)$ | 11111101 | 253 |

TABLE 4-continued

| Input Voltage VIN (V) | Output Data | |
|---|---|---|
| | Binary | Decimal |
| $\left(\dfrac{VREF}{2^8} \times 253.5\right) \leq VIN < \left(\dfrac{VREF}{2^8} \times 254.5\right)$ | 11111110 | 254 |
| $\left(\dfrac{VREF}{2^8} \times 254.5\right) \leq VIN < \left(\dfrac{VREF}{2^8} \times 255.5\right)$ | 11111111 | 255 |

Accordingly, for example, when the input voltage VIN to the A/D converter 55 is 0.05V, $$\left(\dfrac{5}{2^8} \times 2.5\right) \leq 0.05 < \left(\dfrac{5}{2^8} \times 3.5\right) \text{ is obtained.}$$

Hence, the output data D is obtained as follows:

D7 to 0=00000011 (3 in decimal).

Now, resistance values of reference resistance RB and resistances R1 to R6 are as shown in Table 5.

TABLE 5

| Resistance | Resistance Value(Ω) |
|---|---|
| RB | 1000 |
| R1 | 1547 |
| R2 | 1381 |
| R3 | 1245 |
| R4 | 1107 |
| R5 | 992 |
| R6 | 890 |

Hence, for example, when the key switch SW1 is on, the input voltage VIN (equal to analog voltage VA) to the A/D converter 55 is obtained by the following formula:

$$VIN = \dfrac{1000}{1547 + 1000} \times 5.000 = 1.963 V$$

From $$\dfrac{5}{2^8} \times 99.5 \leq 1.963 < \dfrac{5}{2^8} \times 100.5$$

the output data D is obtained as follows:

D 7 to 0=01100100 (100 at decimal).

The entire key switches SW1 through SW6 are computed as the same as the above, thereby obtaining the output data as shown in Table 6.

TABLE 6

| Depressed Key Switch | Input Voltage VIN (V) | Output Data D (Decimal) |
|---|---|---|
| SW1 | 1.953 | 100 |
| SW2 | 2.100 | 107 |
| SW3 | 2.227 | 114 |
| SW4 | 2.373 | 121 |
| SW5 | 2.510 | 128 |
| SW6 | 2.646 | 135 |

The output data D of A/D converter 55 is inputted to the input port at the control unit 56, which carries out processing in accordance with the flow chart to discriminate the depressed key switch.

Next, explanation will be given on the flow chart in FIG. 5. At first, the step S1 decides whether or not the input data D is 97 (decimal value, hereinafter the same) or more. If no, the step 14 decides all the key switches SW1 through SW6 are off. If yes, the processing proceeds to the step S2. The step S2 decides whether or not the input data D is 104 or more. If no, the step S3 decides the key switch SW1 is on. If yes, the processing proceeds to the step S4. In the following steps S4 to S13, it is similarly decided which key switch is on.

Figure 5:
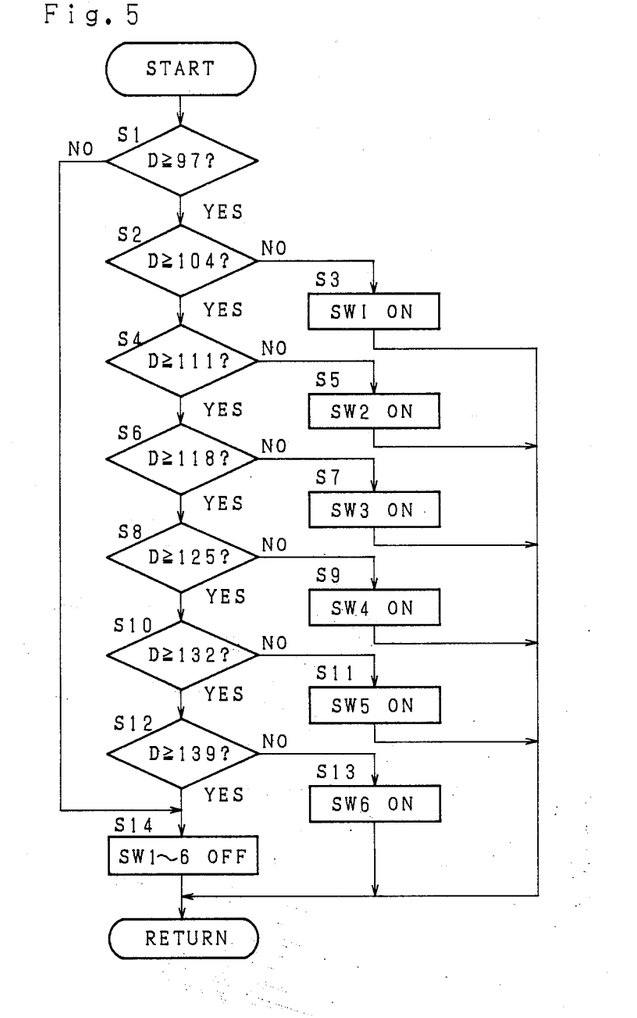
FIG. 5 is a flow chart of processing of a control unit shown in FIG. 4.

Now, explanation will be given on a case where plural key switches among those SW1 to SW6 are simultaneously depressed. For example, when the key switches SW1 and SW2 are simultaneously depressed, the resistances R1 and R2 are connected in parallel to each other, the value being given in the following formula:

$$\dfrac{R1 \times R2}{R1 + R2} = \dfrac{1547 \times 1381}{1547 + 1381} = 729(\Omega),$$

which is smaller than the value 890ω of resistance R6 when the key switch SW6 only is depressed and the output data D thereby becomes 139 or more, whereby in the step S12 in FIG. 5 it is decided as yes and all the key switches are decided to be off. In brief, two high-order parallel resistance values larger in resistance value among the resistances R1 through R6 corresponding to the key switches respectively are set to be lower than the lowest resistance value among the resistances R1 through R6. Hence, when two or more key switches are depressed, all the key switches are decided to be off, thereby preventing other key switches from being misdiscriminated to be on.

The decision of input data D by the flow chart in FIG. 5 is that, when the input data D is not a single value but a value included in a certain range, the corresponding key switch is on. For example, in order to decide that the key switch SW1 is on, the input data D need only be included in a range of 97 to 103 but not 100, in other words, the input voltage VIN is not 1.953V but in a range of 1.885 to 2.021V, which can be shown regarding all the key switches SW1 to SW6 as in the following table 7:

TABLE 7

| Input Data | Range of Input Voltage VIN (V) | Key Switch decided to be ON |
|---|---|---|
| 97~103 | $\left(\dfrac{5}{2^8} \times 96.5\right) \leq VIN < \left(\dfrac{5}{2^8} \times 103.5\right)$ | SW1 |
| 104~110 | $\left(\dfrac{5}{2^8} \times 103.5\right) \leq VIN < \left(\dfrac{5}{2^8} \times 110.5\right)$ | SW2 |
| 111~117 | $\left(\dfrac{5}{2^8} \times 110.5\right) \leq VIN < \left(\dfrac{5}{2^8} \times 117.5\right)$ | SW3 |

TABLE 7-continued

| Input Data | Range of Input Voltage VIN (V) | Key Switch decided to be ON |
|---|---|---|
| 118~124 | $\left(\frac{5}{2^8} \times 117.5\right) \leq VIN < \left(\frac{5}{2^8} \times 124.5\right)$ | SW4 |
| 125~131 | $\left(\frac{5}{2^8} \times 124.5\right) \leq VIN < \left(\frac{5}{2^8} \times 131.5\right)$ | SW5 |
| 132~138 | $\left(\frac{5}{2^8} \times 131.5\right) \leq VIN < \left(\frac{5}{2^8} \times 138.5\right)$ | SW6 |

Thus, an allowable width in a certain range is provided at the input data D, thereby preventing the occurrence of the matter that the key switch, even when depressed, is not decided to be on due to influence of variation in the resistance value caused by an error in the resistances R1 through R6 and the reference resistance RB or the effects of temperature and external noises.

However, in a case where such an allowable width is not required, even when, for example, 45 key switches are provided, it is possible to decide all the key switches are off when two or more of them are depressed simultaneously, thereby preventing the misdiscrimination.

Figure 6:
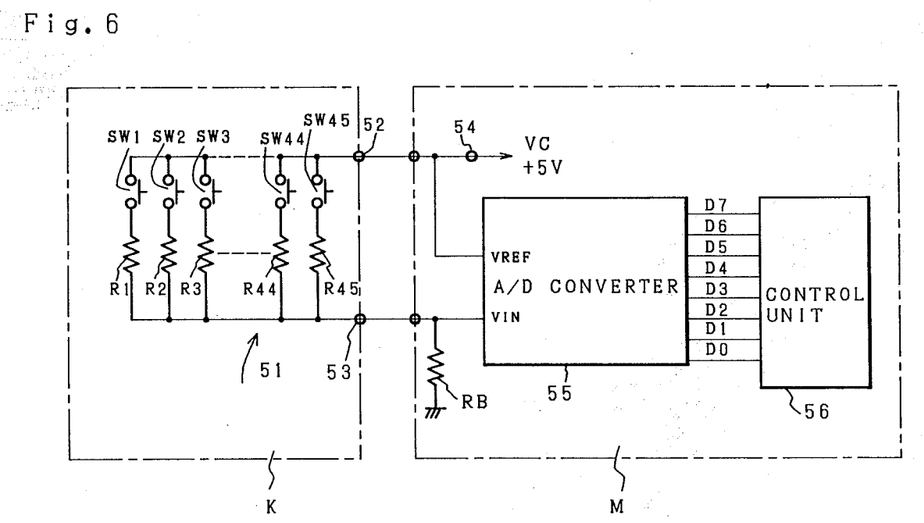
FIG. 6 is a circuit diagram of a third embodiment of the key input apparatus of the invention.

In other words, as shown in the circuit diagram of a third embodiment of the invention in FIG. 6, 45 key switches SW1 through SW45 and resistances R1 through R45 conststitute a variable resistance circuit 51 and when values of resistances R1 through R45 are given as shown in Table 8, parallel resistance values of two high-order resistances R1 and R2 larger in resistance value are given in the following formula:

$$\frac{R1 \times R2}{R1 + R2} = \frac{1534 \times 1510}{1534 + 1510} = 761 \; (\Omega).$$

This is lower than the value 766 ($\Omega$) of resistance R45 of the lowest resistance value, thereby discriminating that a plurality of key switches are depressed and preventing misdiscrimination of the key switch.

TABLE 8

| Input Data | Range of Input Voltage VIN (V) | Resistance Value ($\Omega$) | Key Switch decided to be ON |
|---|---|---|---|
| 101 | $\left(\frac{5}{2^8} \times 100.5\right) \leq VIN < \left(\frac{5}{2^8} \times 101.5\right)$ | R1 = 1534 | SW1 |
| 102 | $\left(\frac{5}{2^8} \times 101.5\right) \leq VIN < \left(\frac{5}{2^8} \times 102.5\right)$ | R2 = 1510 | SW2 |
| ... | ... | ... | ... |
| 144 | $\left(\frac{5}{2^8} \times 143.5\right) \leq VIN < \left(\frac{5}{2^8} \times 144.5\right)$ | R44 = 777 | SW44 |
| 145 | $\left(\frac{5}{2^8} \times 144.5\right) \leq VIN < \left(\frac{5}{2^8} \times 145.5\right)$ | R45 = 766 | SW45 |

In the aforesaid embodiments, when a plurality of key switches are depressed, the input voltage VIN inputted to the A/D converter 55 is higher than the highest input VIN when a single key switch is depressed, whereby the control unit 56 is very easy to process, and the possibility of malfunction, misdecision, or misdiscrimination, is very low. However, when a plurality of key switches are depressed, the input voltage VIN at that time may be medium voltage of each input voltage when the single key switch is depressed, whereby a further large number of key switches are provided to enable accurate decision or discrimination thereof. In other words, the resistance value of a variable resistance circuit, especially the respective resistances R1 through R45, is set so that the input voltage VIN when the plural key switches are simultaneously depressed is different from that when any single key switch is depressed, whereby even when the plural key switches are simultaneously depressed, the misdecision or misdiscrimination can be prevented.

Next, detailed explanation will be given on the constitution of the key unit and a mounting mechanism therefor onto the keyboard.

Figure 7:
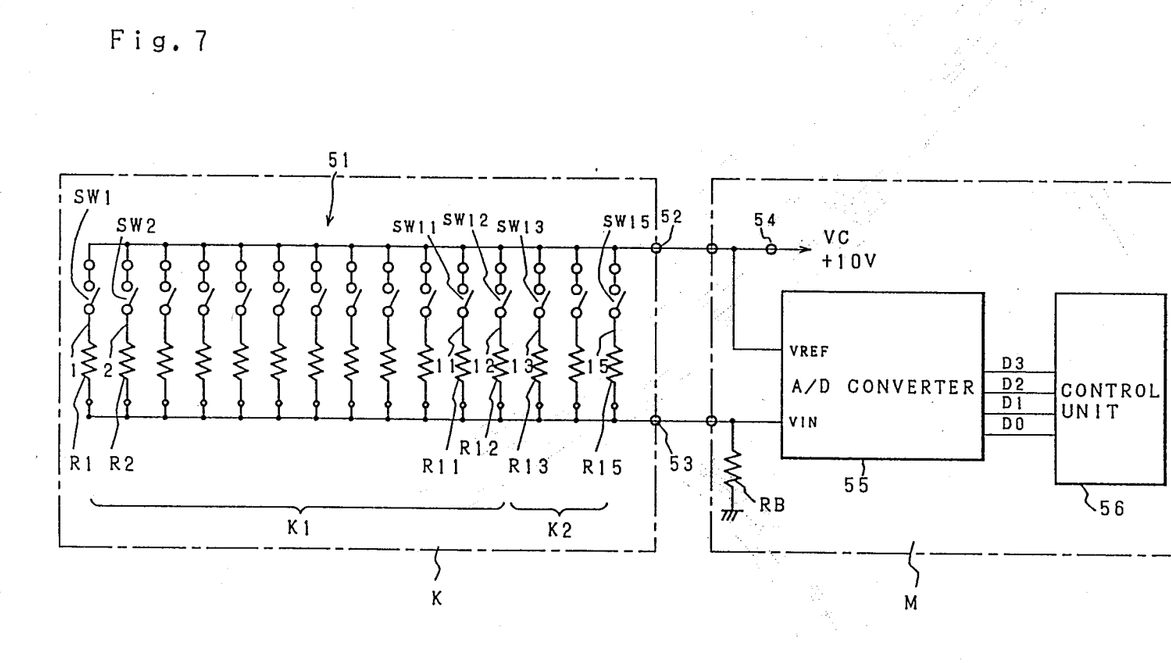
FIG. 7 is a circuit diagram of a fourth embodiment of the key input apparatus of the invention.

FIG. 7 is a circuit diagram of a fourth embodiment of the invention, in which key units 1 through 15 comprising fifteen key switches SW1 through SW15 and resistances R1 through R15 connected in series therewith are connected in parallel to each other so as to constitute a variable resistance circuit 51. Also, the resolution of A/D converter 55 is 4 bits and its reference voltage VREF is 10V. In addition, other elements are the same as the aforesaid first embodiment and omitted from explanation herein.

Figure 8:
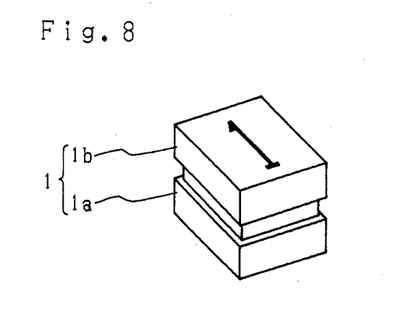
FIGS. 8 and 9 are perspective views of a key unit.
Figure 9:
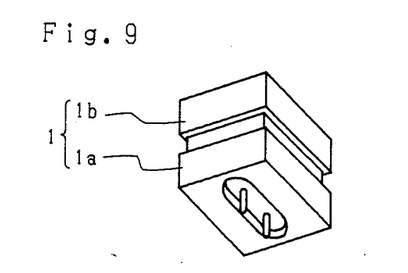

The key unit 1, as shown in FIGS. 8 and 9, has a base 1a and a key top 1b, the base 1a being provided with a male connector CN of two poles.

Figure 10:
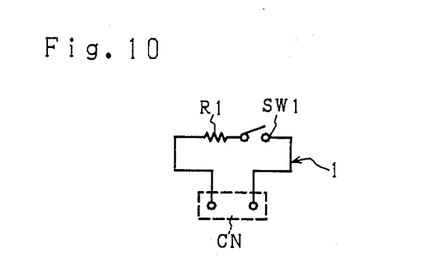
FIG. 10 is a circuit diagram of the key unit.

FIG. 10 is a circuit diagram of the key unit 1, in which the key top 1b is depressed to connect switch SW1 between the terminals of the male connector CN. Other key units 2 through 15 are different only in resistance value and are the same in construction, configuration and size, as the key unit 1.

The keyboard K comprises a ten-key unit K1 on which the key switches 1 through 12 are mounted and an auxiliary key unit K2 on which key units 13 through 15 are mounted (reference to FIG. 7).

Figure 11:
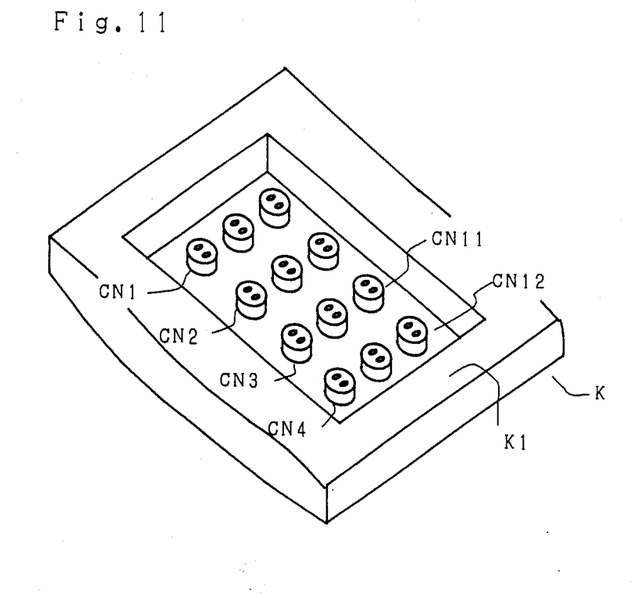
FIG. 11 is a perspective view of the principal portion of the keyboard.

FIG. 11 shows the ten-key unit K1, from which the key units 1 through 12 are removed. In FIG. 11, female connectors CN1 through CN12 are disposed into which the male connectors CN are inserted to enable connection and mounting. The key units are inserted into any female connectors CN1 through CN12 to constitute a resistance circuit 51 shown in FIG. 7, at which time arrangement of key units 1 through 12 is free, for example, may be as shown in FIGS. 1 or 2.

In this embodiment, the input voltage VIN and output data are deemed to have the relation as shown in Table 9. The values in the parantheses of the item of input voltage in Table 9 are the medium values respectively.

TABLE 9

| Input Voltage VIN (V) | | Output Data |
|---|---|---|
| 0–0.625 | (0.3125) | 0000 |
| 0.626–1.250 | (0.9375) | 0001 |
| 1.251–1.875 | (1.5625) | 0010 |
| 1.876–2.500 | (2.1875) | 0011 |
| 2.501–3.125 | (2.8125) | 0100 |
| 3.126–3.750 | (3.4375) | 0101 |
| 3.751–4.375 | (4.0625) | 0110 |
| 4.376–5.000 | (4.6875) | 0111 |
| 5.001–5.625 | (5.3125) | 1000 |
| 5.656–6.250 | (5.9375) | 1001 |
| 6.251–6.875 | (6.5625) | 1010 |
| 6.876–7.500 | (7.1875) | 1011 |
| 7.501–8.125 | (7.8125) | 1100 |
| 8.126–8.750 | (8.4375) | 1101 |
| 8.751–9.395 | (9.0625) | 1110 |
| 9.376–10.000 | (9.6875) | 1111 |

A value of reference resistance RB is assumed to be 200 Ω and values of resistances R1 through R15 are set to equalize analog voltage VA to the medium value of input voltage VIN when each key switch SW1 through SW15 is depressed pressed respectively, which are given in Table 10.

TABLE 10

| Resistance | Resistance Value (Ω) |
|---|---|
| R1 | 1933.3 |
| R2 | 1080.0 |
| R3 | 714.3 |
| R4 | 511.1 |
| R5 | 381.8 |
| R6 | 292.3 |
| R7 | 226.7 |
| R8 | 176.5 |
| R9 | 136.8 |
| R10 | 104.8 |
| R11 | 78.3 |
| R12 | 56.0 |
| R13 | 37.0 |
| R14 | 20.7 |
| R15 | 6.5 |

Then, the output data D0 to D3 after the analog voltage VA generated by the depressed key switch among those SW1 through SW 15 is converted into a digital signal by the A/D converter 55, are given in the following Table11:

TABLE II

| Depressed Key | Output Data |
|---|---|
| none | 0000 |
| SW1 | 0001 |
| SW2 | 0010 |
| SW3 | 0011 |
| SW4 | 0100 |
| SW5 | 0101 |
| SW6 | 0110 |
| SW7 | 0111 |
| SW8 | 1000 |
| SW9 | 1001 |
| SW10 | 1010 |
| SW11 | 1011 |
| SW12 | 1100 |
| SW13 | 1101 |
| SW14 | 1110 |
| SW15 | 1111 |

In the above mentioned embodiment, the arrangement of key units 1 through 12 in the ten-key unit K1 can freely be set or changed and the keys are easy to change corresponding to the purpose for use or the choice of user. Also, it is easy to exchange the key unit between the ten-key unit K1 and the auxiliary key unit K2 or to exchange the key unit with a separate key unit, thereby enabling easy correspondence to an improvement in the keyboard K or modification in the specification.

When the ten-key unit K1 and auxiliary key unit K2 make the key or connector different in configuration or size, in a case where function of auxiliary key unit 2 is quite different in property from the ten-key unit K1, the keys cannot be exchanged between the auxiliary key unit K2 and the ten-key unit K1.

In all the aforesaid embodiments, the variable resistance circuit 51 comprising the key switches and resistances connected in series therewith is used, but, for example, a variable resistance circuit in which a plurality of parallel connectors for one key switch and one resistance are connected in series with each other, or a variable resistance circuit in which key switches are connected to short-circuit between one ends of the resistances connected in series with each other and the other ends of resistances may alternatively be used. When some of resistances of key units are equal in resistance value to each other, a plurality of key units having the same functions can be provided.

Also, the reference resistance RB may be provided at the constant voltage source VC side. The A/D converter 55 may use an A/D converter contained in a microcomputer used for the control unit. The keyboard K may be a panel integral with the main body M.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A key input apparatus with a plurality of key switches for outputting respective information, said key input apparatus comprising:

a variable resistance circuit including a plurality of key units connected with each other in parallel and a pair of terminals, each key unit including a key switch and a resistance element connected with the key switch in series, a voltage generating unit including a power source connected with one terminal of said variable resistance circuit and a resistance element connected with said other terminal of said variable resistance circuit in series for generating an analog voltage corresponding to a resistance value of said variable resistance circuit, and an analog-to-digital converter for converting said analog voltage into a digital signal.

2. A key input apparatus as set forth in claim 1, wherein the resistance element of each key unit has a resistance value different from any other key unit.

3. A key input apparatus as set forth in claim 1, wherein the resistance elements of some of the key units have an equal resistance value.

4. A key input apparatus as set forth in claim 1, wherein the resistance element of each key unit has a unique resistance value relative to the other key units so that the resistance value of said variable resistance circuit when an optional plurality of said key switches are simultaneously operated does not coincide with the resistance value when only an optional one of said key switches is operated.

5. A key input apparatus as set forth in claim 1, wherein the resistance value of said variable resistance circuit when an optional two of said key switches are simultaneously operated is smaller than that when only an optional one of said key switches is operated.

6. A key input apparatus as set forth in claim 1, wherein the analog voltage generated when some of said key switches are simultaneously operated is a medium value voltage of each analog voltage generated when each one of said key switches is operated.

7. A key input apparatus as set forth in claim 1, wherein each of said key units includes a key top for operating the key switch and two plugs connected to both ends of the series circuit of the key switch and the resistance element, respectively, and said apparatus further comprising a keyboard provided with a plurality of receptacles to be detachably fitted to said plugs of the key units.

8. A key input apparatus as set forth in claim 7, wherein said key top, said key switch, said resistance element and said plug in each key unit are integrally constituted.

9. A key input apparatus with a plurality of key switches for outputting respective information, said key input apparatus comprising:
 a plurality of input units, each of the input units comprising a key switch element and a resistance element connected with the key switch element in series, the input units connected with each other in parallel between a first bus-bar applied with a constant voltage and a second bus-bar having an output terminal, and
 an analog-to-digital converter for converting analog voltage outputted from said output terminal into digital values.

10. A key input apparatus as set forth in claim 9, wherein the resistance element of each input unit has a unique resistance value relative to the other input units so that the analog voltage outputted from said output terminal of said second bus bar when an optional plurality of said key switches are simultaneously operated does not coincide with an analog voltage outputted when only an optional one of said key switches is operated.

11. A key input apparatus as set forth in claim 9, wherein said input units are detachably fitted to said first and second bus-bars through connectors respectively.

12. A key input apparatus with a plurality of key switches for outputting respective information. said key input apparatus comprising:
 A plurality of input units, each of the input units including a key switch element, a resistance element connected with the key switch element in series, and two plug members connected to both ends of the series circuit of the key switch element and the resistance element, respectively, said resistance element of each input unit having a different resistance value from each other, and
 a keyboard body including a first bus-bar capable of applying a constant voltage, a second bus-bar having an output terminal outputting analog voltage corresponding to an operation of the key switch elements, and a plurality of connectors arranged on said first and second bus-bars so as to connect said two plug members of each of said input units with the first and second bus-bars, respectively, wherein the input units can be arbitrarily arranged on the keyboard body.

13. An improved keyboard assembly that can be modified to comply with a subjective requirement of a user so that an information processing unit can be responsive to a range of input data from individual key members that is greater than the number of key positions on the keyboard assembly, said assembly comprising:
 a keyboard housing member providing a predetermined number of key positions for key members, each position providing an electrical connection controlled by a key number and permitting removable attachment to a key member;
 a plurality of key members of greater number than the key positions;
 means on each key member for enabling a detachable connection to at least one key position, and
 means on each key member for enabling a unique electrical signal when operated by the user, whereby the electrical signal is representative of input data to the information processing unit and the keyboard housing member can receive subjectively determined key members in any one of its key positions to provide a specific range of input data as subjectively required for operation of the information processing unit.

14. The improved keyboard assembly of claim 13 wherein each key member includes an exterior key housing having an operable upper member responsive to activation by the user, a lower terminal connector for detachable connection to a key position and means, within the exterior key housing, for providing a unique electrical signal representative of that specific key member to the information processing unit through the detachable connection with the electrical connection of a key position on the keyboard housing member.

15. The improved keyboard assembly of claim 14 wherein the unique electrical signal is not duplicated by any one or more key members.

16. The improved keyboard assembly of claim 15 wherein the keyboard housing member includes a pair of common bus connections to each key position.

17. The improved keyboard assembly of claim 16 wherein the means for providing a unique electrical signal comprises a switch assembly and resistor connected in series to the lower terminal connector and connected respectively to the pair of bus connections.

18. An improved keyboard assembly that can be modified to comply with a subjective requirement of a user so that an information processing unit can be responsive to a range of input data from individual key members that is greater than the number of key positions on the keyboard assembly, said assembly comprising:
 a plurality of key members;

a keyboard housing member providing a predetermined number of key positions for key members, each key position having an identical terminal connection and being interchangeable with another key position relative to the purpose of inputting information to the data processing unit and for providing an electrical connection controlled by a key member and permitting removable attachment to a key member;

means on each key member for enabling a detachable connection to each key position, and means on each key member for enabling a unique electrical signal when operated by the user, whereby the electrical signal is representative of input data to the information processing unit and a common keyboard housing member can receive subjectively determined key members to provide a specific range of input data as subjectively required for operation of the information processing unit.

19. In an improved keyboard assembly for a computer-based system having a keyboard housing member providing a predetermined number of key positions for key members, each key position providing an electrical connection that is common to output terminals of the keyboard for interconnection with the computer-based system, the improvement comprising:

a detachable key member having an exterior housing with an operable upper member responsive to activation by the user, a lower terminal connector assembly for detachable connection to any key position on the keyboard housing member and means, within the exterior key member housing, for enabling a unique electrical signal when the upper member is activated by the user, regardless of the specific key position connected to the lower terminal connectors, with the electrical signal transmitted to the output terminals for presentation to the computer-based system.

* * * * *